US011509201B2

(12) United States Patent
Menheere

(10) Patent No.: US 11,509,201 B2
(45) Date of Patent: Nov. 22, 2022

(54) ELECTRIC FAN

(71) Applicant: PRATT & WHITNEY CANADA CORP., Longueuil (CA)

(72) Inventor: David H. Menheere, Norval (CA)

(73) Assignee: PRATT & WHITNEY CANADA CORP., Longueuil (CA)

( * ) Notice: Subject to any disclaimer, the term of this patent is extended or adjusted under 35 U.S.C. 154(b) by 653 days.

(21) Appl. No.: 16/018,162

(22) Filed: Jun. 26, 2018

(65) Prior Publication Data

US 2019/0393763 A1 Dec. 26, 2019

(51) Int. Cl.
*H05K 7/20* (2006.01)
*H02K 16/02* (2006.01)
*F04D 25/04* (2006.01)
*F16H 1/22* (2006.01)
*H02K 7/116* (2006.01)

(52) U.S. Cl.
CPC ........... *H02K 16/02* (2013.01); *F04D 25/045* (2013.01); *F16H 1/22* (2013.01); *H02K 7/116* (2013.01); *H05K 7/20163* (2013.01); *H05K 7/20918* (2013.01)

(58) Field of Classification Search
CPC .......... H02K 16/02; H02K 7/116; H02K 9/06; F04D 25/045; F04D 25/04; G01R 31/68; G01R 31/28; G01R 31/2829; H02M 3/156; H02M 1/08; H03K 17/302; H03K 17/693; H03K 2217/0018; H05K 7/20163; H05K 7/20918
See application file for complete search history.

(56) References Cited

U.S. PATENT DOCUMENTS

| 5,306,183 A | 4/1994 | Holt et al. |
| 8,464,511 B1 | 6/2013 | Ribarov et al. |
| 8,487,466 B2 | 7/2013 | Schroeder |
| 8,952,559 B2 | 2/2015 | Holstein et al. |

(Continued)

FOREIGN PATENT DOCUMENTS

| CN | 107503959 A | 12/2017 |
| CN | 107642434 A | 1/2018 |

(Continued)

OTHER PUBLICATIONS

English translation of China patent document No. CN 107503959 dated Dec. 22, 2017, https://patents.google.com/patent/CN107503959A/en?oq=CN107503959A, accessed on Oct. 30, 2019.

(Continued)

*Primary Examiner* — Gary A Nash
(74) *Attorney, Agent, or Firm* — Norton Rose Fulbright Canada LLP

(57) ABSTRACT

An electric fan for producing thrust to propel an aircraft is disclosed. The electric fan comprises a stator, a fan rotor rotatably mounted relative to the stator and an electric motor mounted to the stator and drivingly engaged with the fan rotor to cause rotation of the fan rotor relative to the stator. The fan rotor comprises an annular body defining a flow passage therethrough and a plurality of fan blades disposed in the flow passage and mounted for common rotation with the annular body about a fan rotation axis. The electric motor has a motor rotation axis that differs from the fan rotation axis.

15 Claims, 6 Drawing Sheets

(56) References Cited

U.S. PATENT DOCUMENTS

| | | |
|---|---|---|
| 9,555,879 B1 | 1/2017 | Kaiser |
| 2008/0226453 A1* | 9/2008 | Nordeen .................. F01D 5/18 416/189 |
| 2010/0156221 A1 | 6/2010 | Dooley |
| 2011/0213537 A1* | 9/2011 | Dooley ................ F01D 21/045 701/100 |
| 2012/0167551 A1 | 7/2012 | Lugg |
| 2017/0320584 A1 | 11/2017 | Menheere |
| 2020/0340406 A1* | 10/2020 | Maljean .................. F02C 7/36 |

FOREIGN PATENT DOCUMENTS

| | | |
|---|---|---|
| EP | 2279113 A2 | 2/2011 |
| EP | 1739007 B1 | 5/2011 |
| GB | 1152274 | 5/1969 |
| WO | 2009153124 A2 | 12/2009 |

OTHER PUBLICATIONS

English translation of China patent document No. CN 107642434 dated Jan. 30, 2018, https://patents.google.com/patent/CN107642434A/en?oq=CN107642434A, accessed on Oct. 30, 2019.

European Patent Office, Extended European Search Report dated Oct. 28, 2019, re application No. 19182714.6.

English translation of international patent No. WO 2009/153124 dated Dec. 23, 2009, https://patents google.com/patent/WO2009153124A2 . . . , accessed on Apr. 12, 2018.

Tony Barry et al., Halbach array fans for aeropropulsion, Talk-Polywell.org, Aug. 5, 2010, http://www.talk-polywell.org/bb/viewtopic.php?f=8&t=2497&start=15, accessed on Feb. 10, 2017.

European Patent Office, Communication pursuant to Article 94(3) EPC dated May 4, 2021 re: European Patent Application No. 19182714.6.

* cited by examiner

ELECTRIC FAN

TECHNICAL FIELD

The disclosure relates generally to fluid propellers such as electric fans.

BACKGROUND

Commercial aircraft are usually propelled by gas turbine engines of the turbofan or turbo-prop type. Existing gas turbine engines can release emissions in the environment and also generate noise. Even though significant progress has been made in reducing emissions and noise generated by aircraft engines, further improvement is desirable.

SUMMARY

In one aspect, the disclosure describes an electric fan comprising:
 a stator;
 a fan rotor rotatably mounted relative to the stator, the fan rotor comprising:
  an annular body defining a flow passage therethrough;
  a ring gear extending around the flow passage; and
  a plurality of fan blades disposed in the flow passage and mounted for common rotation with the annular body about a fan rotation axis; and
 an electric motor mounted to the stator and drivingly engaged with the ring gear to cause rotation of the fan rotor relative to the stator, the electric motor having a motor rotation axis that differs from the fan rotation axis.

The motor rotation axis may be disposed radially outwardly from the flow passage.

The electric motor may be drivingly engaged with the ring gear via a pinion gear.

The motor may be a first motor and the fan may further comprise a second electric motor mounted to the stator. The first and second electric motors may both be drivingly engaged with the ring gear via the pinion gear.

A motor rotation axis of the second electric motor may be substantially coaxial with the motor rotation axis of the first electric motor.

The pinion gear may be disposed between the first and second electric motors.

The first and second electric motors may form a motor pair and the fan may further comprise one or more other motor pairs. Each one or more other motor pairs may be drivingly engaged with the ring gear via a respective other pinion gear.

The fan rotor may be hubless.

The fan may comprise a plurality of roller bearings mounted to the stator. Each roller bearing may have an axis of rotation that is non-parallel to the fan rotation axis. The fan rotor may comprise an annular track for interfacing with the plurality of roller bearings.

The electric motor may be one of a plurality of electric motors drivingly engaged with the ring gear.

The plurality of electric motors may define a plurality of motor pairs circumferentially distributed about the fan rotation axis. Each motor pair may be drivingly engaged with the ring gear via a respective pinion gear. Each motor pair may be disposed radially outwardly from the annular body of the fan rotor.

Embodiments can include combinations of the above features.

In another aspect, the disclosure describes a fluid propeller comprising:
 a stator;
 a rotor rotatably mounted relative to the stator, the rotor comprising:
  an annular body defining a flow passage therethrough;
  a ring gear extending around the flow passage; and
  a plurality of blades disposed in the flow passage and mounted for common rotation with the annular body; and
 a motor mounted to the stator and drivingly engaged with the ring gear to cause rotation of the rotor relative to the stator, the motor having a motor rotation axis that is disposed radially outwardly from the flow passage.

The motor may be one of a plurality of motors drivingly engaged with the ring gear.

The plurality of electric motors may define a plurality of motor pairs circumferentially distributed about the flow passage. Each motor pair may be drivingly engaged with the ring gear via a respective pinion gear.

The motors in each motor pair may be coaxial. The blades may depend radially inwardly from the annular body to define a hubless rotor.

Embodiments can include combinations of the above features.

In a further aspect, the disclosure describes a method of operating an electric fan mounted to an aircraft. The method may comprise:
 electrically driving a bladed rotor of the electric fan to rotate in a first direction to generate forward thrust to propel the aircraft; and
 electrically driving the bladed rotor of the electric fan to rotate in a second direction opposite the first direction to generate reverse thrust.

The method may comprise electrically driving the bladed rotor of the electric fan to rotate in the first direction during flight of the aircraft; and then after a touch-down of the aircraft, electrically driving the bladed rotor of the electric fan to rotate in the second direction.

The method may comprise, during a decent phase of the aircraft:
 ceasing to electrically drive the bladed rotor to rotate in the first direction;
 allowing windmilling of the bladed rotor; and
 generating electricity from the windmilling of the bladed rotor.

The bladed rotor may be a first bladed rotor disposed in a fluid passage and the electric fan may comprise a second bladed rotor disposed in the fluid passage. The method may comprise driving the first and second bladed rotors at different rotational speeds when generating forward thrust.

The method may comprise driving the first and second bladed rotors in opposite directions to each other when generating forward thrust.

Embodiments can include combinations of the above features.

In a further aspect, the disclosure describes an aircraft comprising an electric fan as described herein.

Further details of these and other aspects of the subject matter of this application will be apparent from the detailed description included below and the drawings.

DESCRIPTION OF THE DRAWINGS

Reference is now made to the accompanying drawings, in which.

DETAILED DESCRIPTION

The following disclosure relates to fluid propellers such as electrically-driven fans that can be used to generate thrust for propelling aircraft or for other applications. In some embodiments, the electric fan disclosed herein can be electrically-driven via a plurality of electric motors arranged in a configuration that promotes a relatively high power density and efficient use of space. When used on an aircraft, the electric fan disclosed herein can, in some embodiments, be relatively environmentally friendly, quiet, and have lower maintenance and operating costs than traditional gas turbine engines. Also, the use of such electric fan to propel an aircraft can eliminate the loss of performance that can be associated with gas turbine engines due to decreasing air density with increasing altitude. In some embodiments, the thrust levels generated by an electric fan as disclosed herein can be comparable to a turbofan gas turbine engine of a similar fan diameter. In some embodiments, the electric fan disclosed herein can be used to generate reverse thrust during landing of an aircraft for example and either reduce or eliminate the need for conventional thrust reversers provided on aircraft engines. The electric fan disclosed herein can be used to propel an aircraft during various phases of operation of the aircraft including when the aircraft is in flight or on the ground (e.g., during taxiing).

Aspects of various embodiments are described through reference to the drawings.

Figure 1:
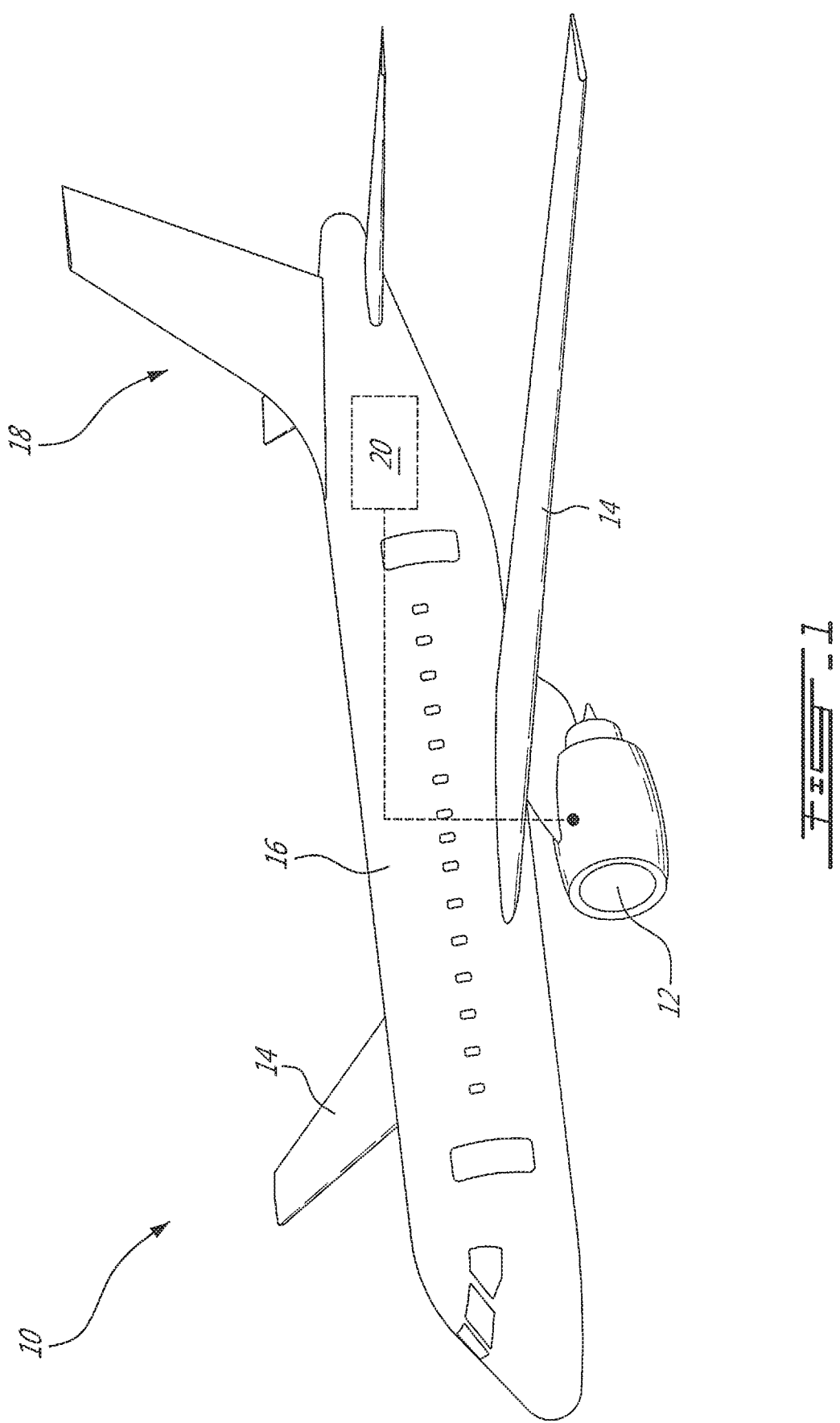
FIG. 1 is a perspective view of an exemplary aircraft comprising an electric fan as described herein.

FIG. 1 is a perspective view of an exemplary aircraft 10 comprising electric fan 12 as described herein. Aircraft 10 can be any type of aircraft such as a commercial passenger aircraft. Aircraft 10 can be a fixed-wing aircraft. Aircraft 10 can comprise one or more electric fans 12 (referred hereinafter in the singular), wings 14, fuselage 16 and empennage 18. Electric fan 12 can be mounted to wing 14 or to fuselage 16 of aircraft 10 and may serve to produce thrust for propulsion of aircraft 10. In some situations, electric fan 12 may supplement or serve as a substitute for one or more conventional gas turbine engines for propelling aircraft 10. Even though the exemplary embodiments described herein relate to electric fans configured to interact with air, it is understood that aspects of the present disclosure can also apply generally to fluid propellers that can be configured to interact with air or other fluids.

Electric fan 12 can be electrically coupled and powered via any suitable electric power source(s) 20 onboard aircraft 10. In some embodiments, power source 20 can comprise one or more batteries. In some embodiments, power source 20 can comprise an auxiliary power unit (APU) drivingly engaged with a suitable electric generator. Such APU can comprise a gas turbine or other combustion engine that is disposed in an aft portion (e.g., tail) of aircraft 10 for example.

Figure 2:
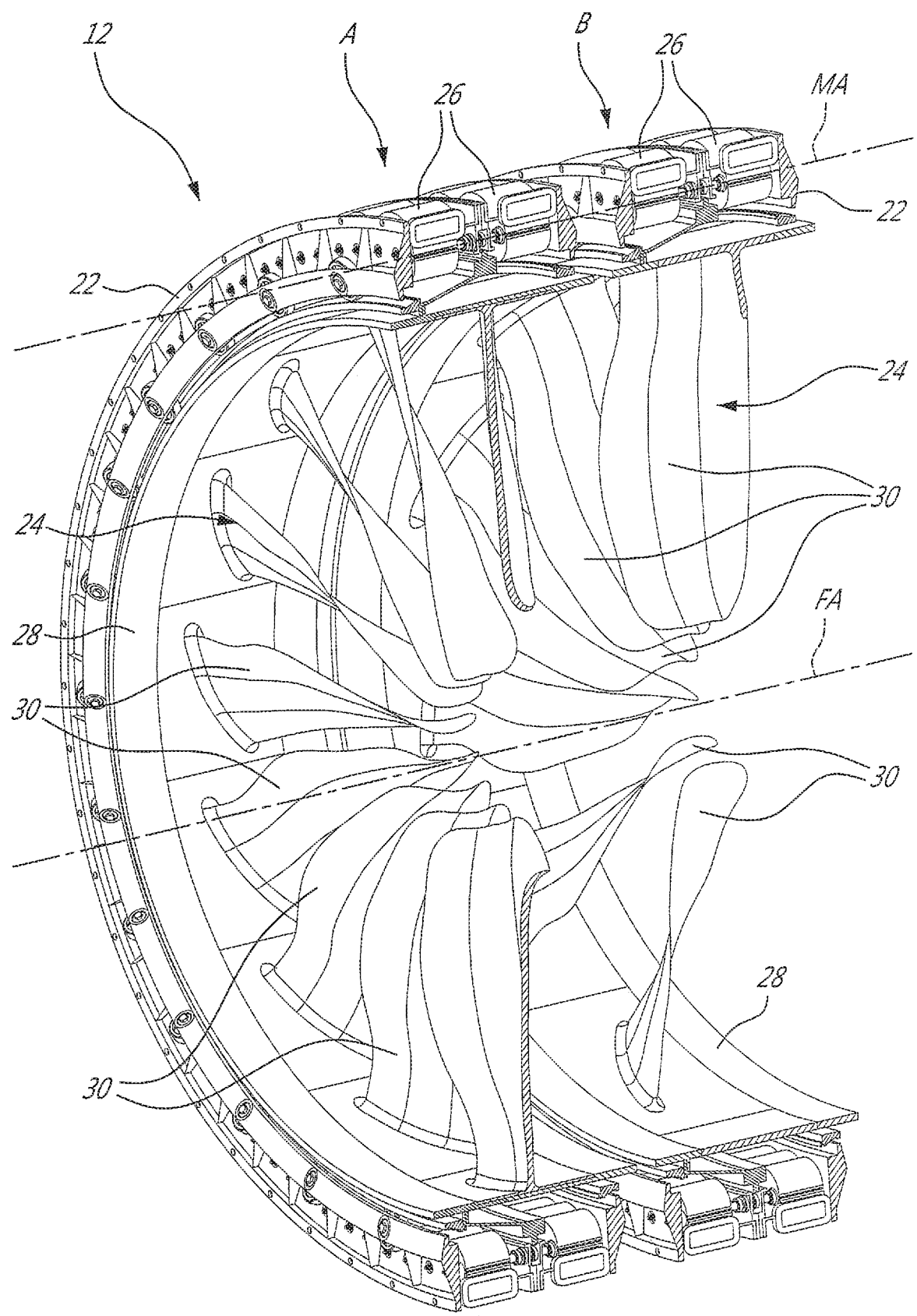
FIG. 2 is a perspective axial cross-section view of an exemplary electric fan.

FIG. 2 is a perspective axial cross-section view of an exemplary electric fan 12 of aircraft 10. Electric fan 12 can be housed inside a suitable nacelle, which is not shown in FIG. 2. In various embodiments, electric fan 12 can have a single-stage or a multi-stage configuration. FIG. 2 illustrates a dual-stage configuration where like elements of fan stages A and B are identified using like reference numerals. First stage A and second stage B of electric fan 12 can have a generally similar configuration so the following description of various elements of electric fan 12 is presented in relation to one of the stages.

Electric fan 12 can comprise stator 22, fan rotor 24 and one or more electric motors 26 mounted to stator 22 and drivingly engaged with fan rotor 24 to cause rotation of fan rotor 24 relative to stator 22. Fan rotor 24 can be rotatably mounted relative to stator 22 for rotation about fan rotation axis FA. Fan rotor 24 can comprise annular body 28 defining a flow passage therethrough. Fan rotor 24 can comprise a plurality of fan blades 30 disposed in the flow passage and mounted for common rotation with annular body 28 about fan rotation axis FA.

Motor(s) 26 can each have a motor rotation axis MA that differs from fan rotation axis FA. For example, motor rotation axis MA can be disposed radially outwardly from the flow passage defined by annular body 28. In some embodiments, motor rotation axis MA can be disposed radially outwardly from annular body 28. In some embodiments, motor rotation axis MA can be substantially parallel to fan rotation axis FA. In some embodiments, motor rotation axis MA can be radially offset from fan rotation axis FA.

In some embodiments, fan blades 30 can be secured to annular body 28 and depend radially inwardly from annular body 28 and into the inner flow passage defined by annular body 28. In some embodiments, fan blades 30 can define a hubless fan rotor 24. For example, inner ends of fan blades 30 can be free (i.e., not connected to any other structure) and can define an unobstructed central passage into which fluid flow can be induced during rotation of fan rotor 24. Alternatively, it is understood that aspects of the present disclosure are also applicable to bladed rotors that have central hubs. Accordingly, in various embodiments, fan rotor 24 can have a central hub or can be hubless.

In some dual-stage embodiments of electric fan 12, stages A and B can be configured for counter-rotation during operation of electric fan 12. Since stages A and B of electric fan 12 can be independently driven and controlled via separate electric motors 26, fan rotors 24 of stages A and B can be driven in different directions and/or at different rotational speeds depending on operating conditions and for optimization of flow conditions in the flow passage defined by annular body 28. For example, the shapes of fan blades 30 of stage A can be different from the shapes of fan blades 30 of stage B due to the counter-rotation configuration and/or other reasons. In some embodiments, the counter-rotation of fan rotors 24 of stages A and B can reduce or eliminate the need for the presence of stator vanes inside the flow passage defined by annular body 28. For example, second stage B can be configured to partially counteract some of the flow disturbances in the fluid caused by first stage A. For example, second stage B can be configured to at least partially undo some of the swirling induced in the fluid flow by the first stage and also straighten the flow of fluid exiting electric fan 12 in order to orient the thrust produced by electric fan 12 accordingly (e.g., substantially along fan rotation axis FA). It is understood that electric fan 12 can comprise a single stage or two or more stages. In some embodiments, each fan rotor 24 can be configured to be driven in one rotational direction during a first mode of operation to generate forward thrust and in an opposite rotational direction during a second mode of operation to generate reverse thrust.

Figure 3:
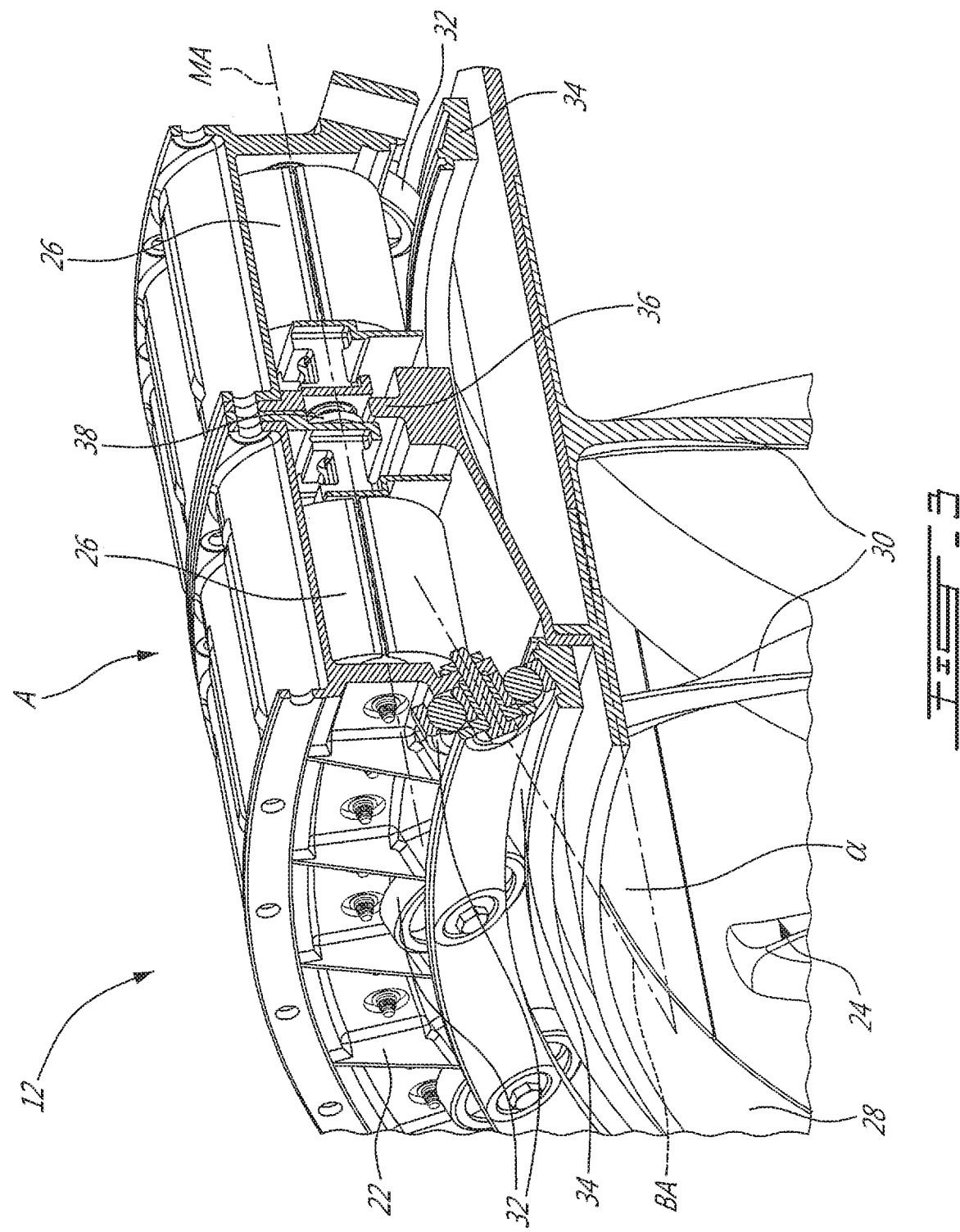
FIG. 3 is an enlarged perspective axial cross-section view of a portion of the electric fan of FIG. 2.

FIG. 3 is an enlarged perspective axial cross-section view of a portion of electric fan 12. Fan rotor 24 can be rotatably mounted relative to stator 22 via one or more bearings 32. In some embodiments, bearings 32 can be rolling-element (roller) bearings. In some embodiments, bearings 32 can be ball bearings. In some embodiments, electric fan 12 can comprise a plurality of bearings 32 serving as an interface between stator 22 and fan rotor 24. For example, bearings 32 can be arranged in a circular array where bearings 32 are circumferentially spaced apart about fan axis FA. In some embodiments, a first circular array of bearings 32 can be disposed forward of motor(s) 26 and a second circular array of bearings 32 can be disposed aft of motor(s) 36. For example, motor(s) 26 can be disposed axially between the forward array of bearings 32 and the aft array of bearings 32. Each bearing 32 can be mounted to stator 22 and interface with annular track 34 of fan rotor 24. For example, each bearing 32 can have an inner race that is secured to stator 22 and an outer race that engages with (e.g., rolls against and is guided by) track 34.

In some embodiments, a forward annular track 34 can be provided for interfacing with the forward array of bearings 32 and an aft annular track 34 can be provided for interfacing with the aft array of bearings 32. In some embodiments, each bearing 32 can have a bearing rotation axis BA that is tilted (i.e., non-parallel, oblique) by a non-zero tilt angle α relative to fan rotation axis FA. The tilt angle α of the bearing rotation axis BA relative to fan rotation axis FA can facilitated the transfer of thrust loads between stator 22 and fan rotor 24. In some embodiments, forward bearings 32 can have a bearing rotation angle BA that is tilted in one direction (e.g., positive) relative to fan rotation axis FA and aft bearings 32 can be tilted in the opposite direction (e.g., negative) relative to fan rotation axis FA to facilitate the transfer of both forward and reverse thrust loads between stator 22 and fan rotor 24.

Fan rotor 24 can comprise ring gear 36 extending around the flow passage defined by annular body 28. In some embodiments, ring gear 36 can be disposed on a radially outer side of annular body 28. Ring gear 36 can be directly or indirectly secured to annular body 28 to form part of fan rotor 24. Ring gear 36 can comprise teeth (not shown) facing radially outwardly for meshing with teeth (not shown) of pinion gears 38. It is understood that ring gear 36 could instead comprise teeth (not shown) facing radially inwardly for meshing with teeth (not shown) of pinion gears 38.

Electric motors 26 can be drivingly engaged to ring gear 36 via one or more pinion gears 38. In some embodiments, a plurality of electric motors 26 can be configured to cooperatively drive fan rotor 24 via ring gear 36. For example, a plurality of electric motors 26 can each be drivingly engaged with ring gear 36 via respective pinion gears 38. For example, the plurality of electric motors 26 can be arranged in a circular array (circumferential set) of electric motors 26 that are circumferentially distributed about fan rotor 24. In some embodiments, the plurality of electric motors 26 can be arranged in two circular arrays of electric motors 26 that cooperatively drive the same fan rotor 24. In some embodiments, the arrangement of the plurality of electric motors 26 illustrated herein can promote efficient use of space and relatively high power density.

In some embodiments, the plurality of electric motors 26 can define a plurality of motor pairs circumferentially distributed about fan rotation axis FA. For example, two electric motors 26 defining a motor pair are identified in FIG. 3. Each motor pair can be drivingly engaged with ring gear 36 via a respective pinion gear 38. The two electric motors 26 of a motor pair can be drivingly engaged with ring gear 36 via the same pinion gear 38. The two electric motors 26 in each motor pair can be coaxial and share the same motor rotation axis MA. Pinion gear 38 can be disposed axially between the two electric motors 26 of the motor pair. Motor rotation axis MA can represent an axis about which a rotor of electric motor 26 rotates. In some embodiments, one electric motor 26 of a motor pair can be part of one circular array of electric motors 26 and the other electric motor 26 of the same motor pair can be part of another circular array of electric motors 26. In other words, the plurality of electric motors 26 can be arranged to define a circular array of motor pairs extending about the flow passage defined by annular body 28.

Figure 4:
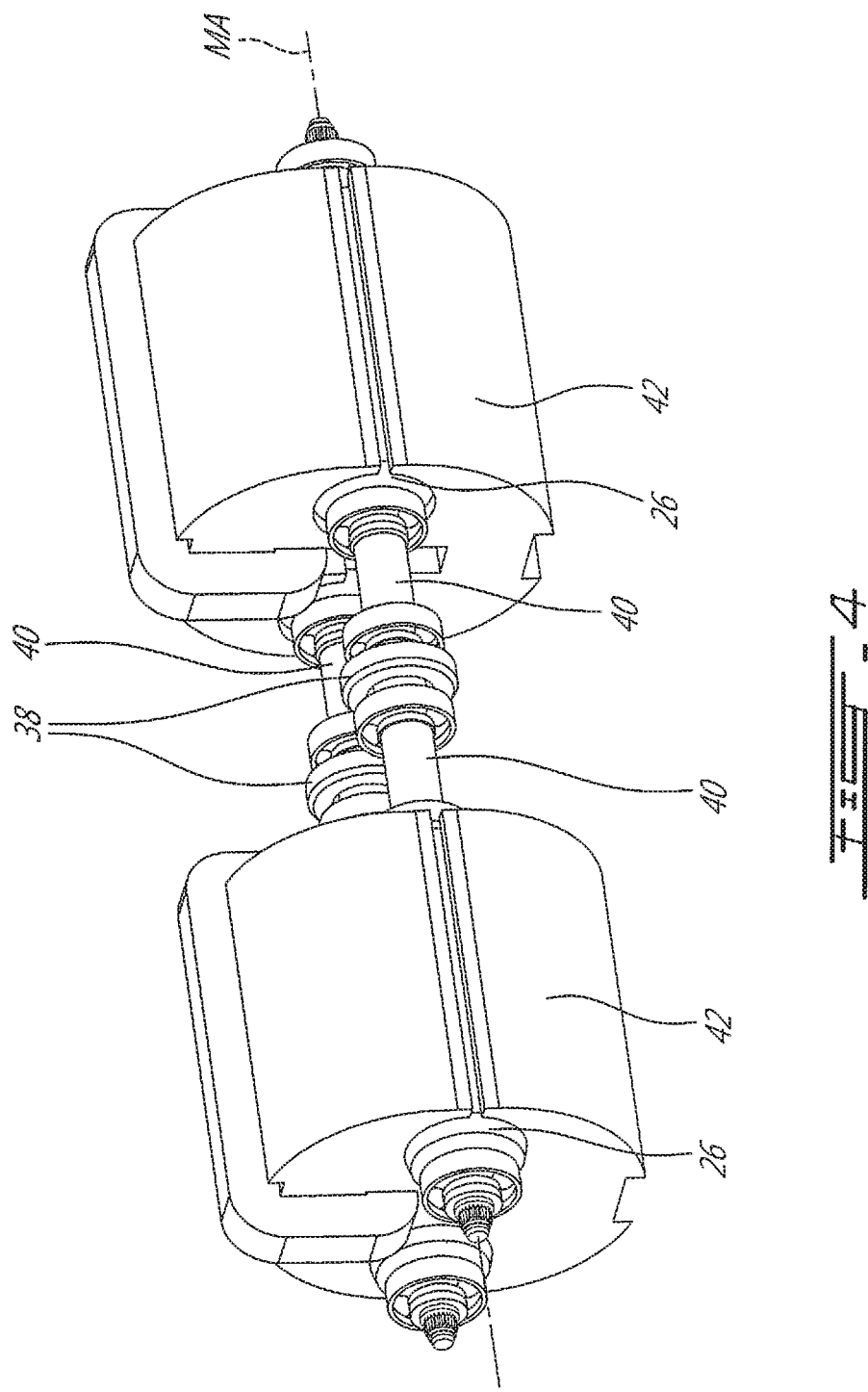
FIG. 4 is a perspective view of exemplary electric motors of the electric fan of FIG. 2.

FIG. 4 is a perspective view of two exemplary pairs of electric motors 26 in isolation from electric fan 12. Each electric motor 26 of a motor pair can be drivingly engaged to the common pinion gear 38 via respective motor shafts 40. In some embodiments, adjacent electric motors 26 in the same circular array can share a common motor stator 42.

Figure 5:
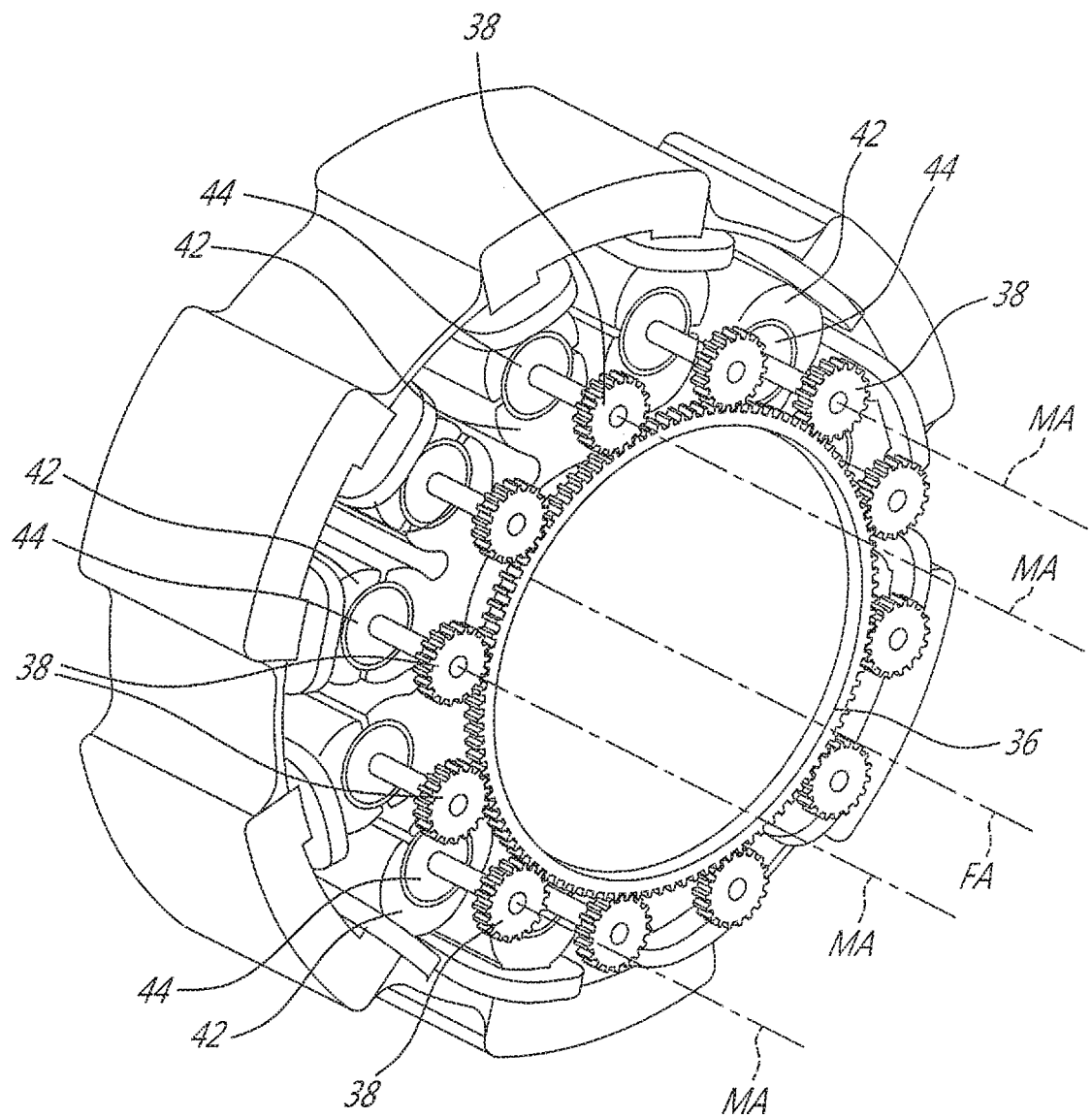
FIG. 5 is a perspective view of an exemplary configuration of the electric motors of the electric fan of FIG. 2.

FIG. 5 is a perspective view of an exemplary configuration of electric motors 26 of electric fan 12. FIG. 5 shows a single circular array of electric motors 26 drivingly engaged with ring gear 36. It is understood that one stage of electric fan 12 can comprise a single circular array of electric motors 26 where electric motors 26 are drivingly engaged to ring gear 36 via respective pinion gears 38, or, the one stage of electric fan 12 can comprise two circular arrays of electric motors 26 defining motor pairs that are drivingly engaged to ring gear 36 via respective pinion gears 38.

In some embodiments, electric motors 26 may be configured as a multi-rotor electric machine of the type disclosed in U.S. Pat. No. 8,232,700 entitled "MULTI-ROTOR ELECTRIC MACHINE", which is incorporated herein by reference. In some embodiments, this arrangement can provide a relatively high power to weight ratio and may be suitable for physical integration into electric fan 12 within a space defined inside a nacelle housing electric fan 12. Electric motors 26 can each comprise motor stator 42 and motor rotor 44. In some embodiments, each motor rotation axis MA can be radially offset from fan rotation axis FA at a substantially uniform offset distance.

In some embodiments, electric motors 26 can be operated to provide phased rotary power to ring gear 36 by using torque phasing between some electric motors 26 to allow for the torque application on ring gear 36 to be more evenly distributed. For example, in reference to the single array of electric motors 26 shown in FIG. 5, torque phasing can be used between different electric motors 26 in the array so that torque pulses are not applied to ring gear 36 by all electric motors 26 simultaneously. This type of torque phasing can be applied to more evenly distribute the torque application with respect to time. In reference to the dual array of electric motors 26 shown in FIGS. 2 and 3, torque phasing can similarly be used between different motor pairs so that torque pulses are not applied to ring gear 36 by all motor pairs simultaneously. In some embodiments, torque phasing (e.g., 90°) can be applied between electric motors 26 of the same motor pair to more evenly distribute the torque application on the common pinion gear 38 with respect to time. In some embodiments, torque phasing can be used to provide a smoother torque application and reduce the magnitude of torque spikes that could otherwise be applied to pinion gears 38 and/or ring gear 36. The structure and principle operation of the arrangement of electric motors 26 illustrated in FIG. 5 are described in U.S. Pat. No. 8,232,700.

Figure 6:
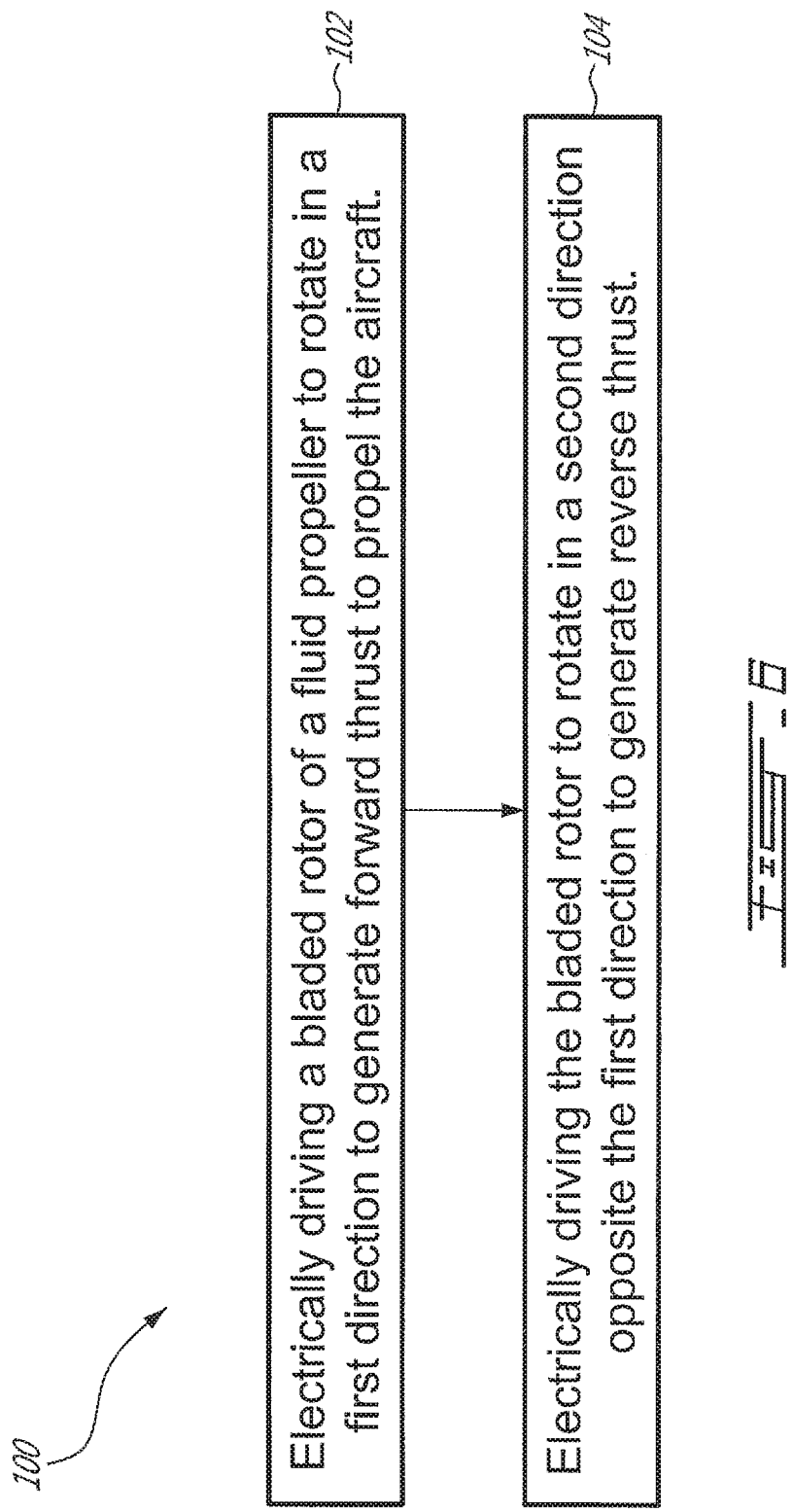
FIG. 6 is a flowchart of a method for operating an electric fan mounted to an aircraft.

FIG. 6 is a flowchart of a method 100 for operating electric fan 12 when mounted to aircraft 10. Method 100 can be conducted using electric fan 12 as described herein or using other types of fluid propellers suitable for generating thrust for propelling aircraft 10. Method 100 can comprise:

electrically driving a bladed rotor such as fan rotor 24 of electric fan 12 to rotate in a first direction to generate forward thrust to propel aircraft 10 (see block 102); and electrically driving the bladed rotor of electric fan 12 to rotate in a second direction opposite the first direction to generate reverse thrust (see block 104).

For example, fan rotor 24 can be electrically driven to rotate in the first direction during flight of the aircraft; and then after a touch-down of aircraft 10, fan rotor 24 can be electrically driven to rotate in the second direction. Method 100 can comprise ceasing to electrically drive fan rotor 24 to rotate in the first direction before reversing the direction of rotation of fan rotor 24.

In some embodiments where electric fan has two stages A and B (see FIG. 2), method 100 can comprise driving the two fan rotors 24 at different rotational speeds when generating forward thrust. In some embodiments, method 100 can comprise driving the two fan rotors 24 in opposite directions to each other when generating forward thrust.

In some embodiments, one or more electric motors 26 can operate as electric motors when driving fan rotor 24 and can operate as electric generators when fan rotor 24 is caused to rotate by the air passing through the flow passage defined by annular body 28. In some embodiments, method 100 can comprising ceasing to electrically drive fan rotor 24 to rotate in the first (or second) direction and then allowing windmilling of fan rotor 24. During descent phase of flight of aircraft 10 for example, fan rotor 24 can be allowed to "windmill" and cause to drive electric motors 26 as electric generators for the purpose of generating electrical energy for use onboard aircraft 10. In some embodiments, the electrical energy generated can be used to recharge one or more batteries (e.g., of power source 20) for example. It is understood that the use of electric motors 26 to generate electricity during windmilling can be incorporated with method 100 or can be part of a different method. Fan rotor 24 can also be stopped from rotating via suitable control of electric motors 26 so as to produce drag during movement of aircraft 10 to which electric fan 12 is mounted. It is understood that allowing windmilling of fan rotor 24 would also produce drag during movement of such aircraft 10.

The above description is meant to be exemplary only, and one skilled in the relevant arts will recognize that changes may be made to the embodiments described without departing from the scope of the invention disclosed. The present disclosure may be embodied in other specific forms without departing from the subject matter of the claims. The present disclosure is intended to cover and embrace all suitable changes in technology. Modifications which fall within the scope of the present invention will be apparent to those skilled in the art, in light of a review of this disclosure, and such modifications are intended to fall within the appended claims. Also, the scope of the claims should not be limited by the preferred embodiments set forth in the examples, but should be given the broadest interpretation consistent with the description as a whole.

What is claimed is:

1. An electric fan comprising:
a stator;
a fan rotor rotatably mounted relative to the stator, the fan rotor comprising:
an annular body defining a flow passage therethrough;
a ring gear extending around the flow passage; and
a plurality of fan blades disposed in the flow passage and mounted for common rotation with the annular body about a fan rotation axis; and
an electric motor mounted to the stator and drivingly engaged with the ring gear to cause rotation of the fan rotor relative to the stator, the electric motor having a motor rotation axis that differs from the fan rotation axis.

2. The fan as defined in claim 1, wherein the motor rotation axis is disposed radially outwardly from the flow passage.

3. The fan as defined in claim 1, wherein the electric motor is drivingly engaged with the ring gear via a pinion gear.

4. The fan as defined in claim 3, wherein the motor is a first motor and the fan further comprises a second electric motor mounted to the stator, the first and second electric motors both being drivingly engaged with the ring gear via the pinion gear.

5. The fan as defined in claim 4, wherein a motor rotation axis of the second electric motor is substantially coaxial with the motor rotation axis of the first electric motor.

6. The fan as defined in claim 5, wherein the pinion gear is disposed between the first and second electric motors.

7. The fan as defined in claim 4, wherein the first and second electric motors form a motor pair and the fan further comprises one or more other motor pairs, each one or more other motor pairs being drivingly engaged with the ring gear via a respective other pinion gear.

8. The fan as defined in claim 1, wherein the fan rotor is hubless.

9. The fan as defined in claim 1, comprising a plurality of roller bearings mounted to the stator, each roller bearing having an axis of rotation that is non-parallel to the fan rotation axis, wherein the fan rotor comprises an annular track for interfacing with the plurality of roller bearings.

10. The fan as defined in claim 1, wherein the electric motor is one of a plurality of electric motors drivingly engaged with the ring gear.

11. The fan as defined in claim 10, wherein:
the plurality of electric motors define a plurality of motor pairs circumferentially distributed about the fan rotation axis;
each motor pair is drivingly engaged with the ring gear via a respective pinion gear; and
each motor pair is disposed radially outwardly from the annular body of the fan rotor.

12. A fluid propeller comprising:
a stator;
a rotor rotatably mounted relative to the stator, the rotor comprising:
an annular body defining a flow passage therethrough;
a ring gear extending around the flow passage; and
a plurality of blades disposed in the flow passage and mounted for common rotation with the annular body; and
a motor mounted to the stator and drivingly engaged with the ring gear to cause rotation of the rotor relative to the stator, the motor having a motor rotation axis that is disposed radially outwardly from the flow passage.

13. The fluid propeller as defined in claim 12, wherein the motor is one of a plurality of motors drivingly engaged with the ring gear.

14. The fluid propeller as defined in claim 13, wherein:
the plurality of electric motors define a plurality of motor pairs circumferentially distributed about the flow passage; and
each motor pair is drivingly engaged with the ring gear via a respective pinion gear.

15. The fluid propeller as defined in claim 14, wherein:
the motors in each motor pair are coaxial; and
the blades depend radially inwardly from the annular body to define a hubless rotor.

* * * * *